United States Patent
Seki et al.

(10) Patent No.: US 7,265,590 B2
(45) Date of Patent: Sep. 4, 2007

(54) SEMICONDUCTOR APPARATUS FOR MONITORING CRITICAL PATH DELAY CHARACTERISTICS OF A TARGET CIRCUIT

(75) Inventors: Takahiro Seki, Kanagawa (JP); Masakatsu Nakai, Kanagawa (JP); Tetsumasa Meguro, Tokyo (JP)

(73) Assignee: Sony Corporation (JP)

( * ) Notice: Subject to any disclaimer, the term of this patent is extended or adjusted under 35 U.S.C. 154(b) by 441 days.

(21) Appl. No.: 10/713,365

(22) Filed: Nov. 14, 2003

(65) Prior Publication Data
US 2004/0130372 A1    Jul. 8, 2004

(30) Foreign Application Priority Data
Nov. 26, 2002  (JP) .......................... P2002-342757

(51) Int. Cl.
*H03K 5/19* (2006.01)
(52) U.S. Cl. .......................... 327/20; 714/700
(58) Field of Classification Search .................. 327/20, 327/149, 153, 158, 161, 263, 270, 271, 276; 713/400; 714/700; 365/233
See application file for complete search history.

(56) References Cited

U.S. PATENT DOCUMENTS 6,629,250 B2 * 9/2003 Kopser et al. .............. 713/401
6,944,801 B2 * 9/2005 Kojima ....................... 714/700

\* cited by examiner

*Primary Examiner*—Linh My Nguyen
(74) *Attorney, Agent, or Firm*—Lerner, David, Littenberg, Krumholz & Mentlik, LLP

(57) ABSTRACT

A semiconductor apparatus for flexibly and effectively configuring a delay monitor circuit without an increase in circuit scale includes a delay signal generation circuit for switching the configuration of delay element arrays based on first configuration information and second configuration information and propagating a delay element array wherein a pulse is switched, a register group having a first register for the first configuration information and a second register for second configuration information, a selector for outputting to the delay signal generation circuit the first configuration information and second configuration information in accordance with an instruction of a selection signal in a time sharing way, and a control circuit for controlling a power source voltage based on delay information of a delay element array and outputting to the selector a selection signal to select from the first configuration information and second configuration information in a time sharing way.

11 Claims, 7 Drawing Sheets

FIG. 3A CK 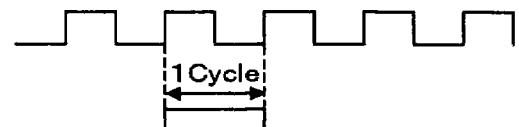
FIG. 3B S141a 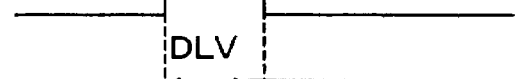
FIG. 3C S142 
FIG. 3D S142 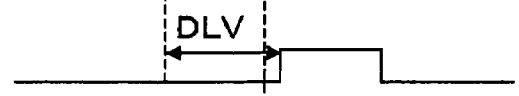
FIG. 3E S141b 
FIG. 4
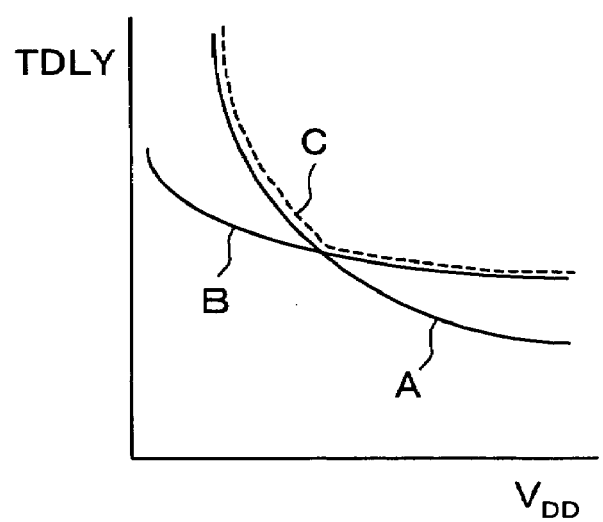

SEMICONDUCTOR APPARATUS FOR MONITORING CRITICAL PATH DELAY CHARACTERISTICS OF A TARGET CIRCUIT

BACKGROUND OF THE INVENTION

1. Field of the Invention

The present invention relates to a semiconductor apparatus having a monitor circuit for perceiving critical path delay characteristics of a target circuit, and particularly relates to a technique of attaining a low power consumption by adaptively controlling a power source voltage supplied to an LSI as the target circuit.

2. Description of the Related Art

In recent years, a method of lowering a power source voltage for attaining a low power consumption has been generally used in a semiconductor circuit. This is because AC components of a power consumption of a semiconductor circuit (LSI) is proportional to a square of a power source voltage, and a reduction of the power source voltage is the most effective for lowering a power consumption of the LSI.

From such a viewpoint, in recent years, there has been reported a method for adaptively supplying a minimum voltage for operating an LSI by dynamically controlling a power source voltage against unevenness of an operation frequency and a process of the LSI and temperature changes.

In an example of realizing control of the above adaptive power source voltage, a delay circuit for generating delay corresponding to a critical path of an LSI is installed, and an operation clock frequency of a target circuit as an object of the power source controlling is compared with a delay value of the delay circuit, and the power source voltage is controlled so that the delay value of the delay circuit falls into an operation clock cycle (for example, refer to the Japanese Unexamined (Kokai) Patent Publication No. 2000-216338, No. 2000-295084 and No. 2002-100967).

Also, the critical path of the LSI is switched due to changes of the operation voltage and process in some cases.

To deal with the switching of the critical path as such, there has been proposed a method for installing a plurality of delay circuits and selecting one having the largest delay among delay values of the all delay circuits in order to control the power source voltage.

However, installation of a large number of delay circuits for dealing with the path switching leads to an increase of the circuit scale, and trade-off imbalance arises between delay monitoring accuracy and the circuit scale due to the delay circuits.

SUMMARY OF THE INVENTION

An object of the present invention is to provide a semiconductor apparatus by which a delay monitor circuit is flexibly and effectively configured while suppressing an increase of the circuit scale to minimum.

To attain the above object, according to a first aspect of the present invention, there is provided a semiconductor apparatus having a delay monitor circuit for perceiving critical path delay characteristics of a target circuit, wherein the delay monitor circuit comprises a delay means having a plurality of delay elements for forming delay element arrays in accordance with supplied configuration information including a delay component to cause signal propagation delay inside the target circuit; a plurality of registers to be set a plurality of configuration information for forming the delay element arrays; and a switching means for selectively switching the configuration information of the plurality of registers and supplying to the delay means.

According to a second aspect of the present invention, there is provided a semiconductor apparatus having a delay monitor circuit for perceiving critical path delay characteristics of a target circuit including a plurality of circuits operating at different clock frequencies, wherein the delay monitor circuit comprises a delay means having a plurality of delay elements for forming delay element arrays in accordance with supplied configuration information including a delay component to cause signal propagation delay inside the target circuit; a plurality of registers to be set a plurality of configuration information for forming the delay element arrays in accordance with the plurality of different frequencies; a first switching means for selectively switching the configuration information of the plurality of registers and supplying to the delay means; and a second switching means for selectively switching the plurality of clocks and supplying to the delay means.

According to the present invention, a plurality of configuration information set in a plurality of registers is switched in a time sharing way to be supplied to a delay means.

In the delay means, a delay element array based on the supplied configuration information is configured in a time sharing way. The delay element array based on different configuration information is propagated to a predetermined clock, and the delay information based on the different configuration information is supplied to a control circuit.

In the control circuit, a plurality of delay information generated by a plurality of delay element arrays formed by the delay means is compared, delay information having the largest delay value is judged to be the final delay information, and a power source voltage value to be supplied to the target circuit is controlled based on the final delay information.

BRIEF DESCRIPTION OF DRAWING

These and other objects and features of the present invention will become clearer from the following description of the preferred embodiments given with reference to the attached drawings, in which:

FIG. 3 is a timing chart of an operation of delay detection;

FIG. 4 is a schematic view of switching of a critical path having different delay characteristics;

DESCRIPTION OF THE PREFERRED EMBODIMENTS

Below, preferred embodiments of the present invention will be explained with reference to the attached drawings.

First Embodiment

Figure 1:
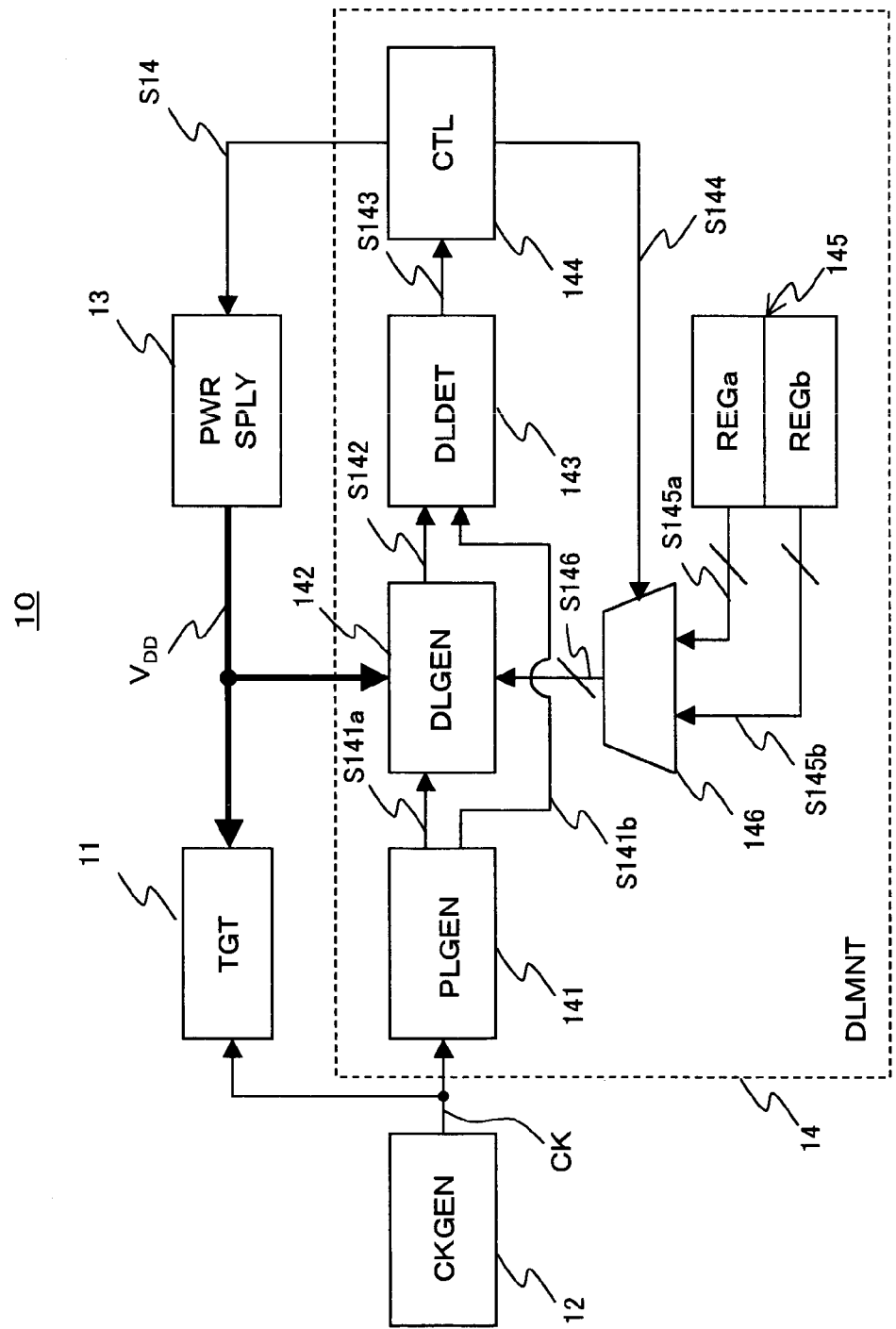
FIG. 1 is a block diagram of a key part of a first embodiment of a semiconductor apparatus according to the present invention.

FIG. 1 is a block diagram of a first embodiment of a semiconductor apparatus according to the present invention.

The present semiconductor apparatus 10 comprises, as shown in FIG. 1, a target circuit (TGT) 11, a clock generation circuit (CKGEN) 12, a power source voltage supply circuit (PWRSPLY) 13 and a delay monitor circuit (DLMNT) 14.

The target circuit 11 comprises a semiconductor circuit (LSI) including a DSP, CPU or other logic circuits supplied with a power source voltage $V_{DD}$ from the power source voltage supply circuit 13 and operating in synchronization with a clock CK by the clock generation circuit 12.

The clock generation circuit 12 generates a clock CK having a predetermined frequency and supplies to the target circuit 11 and the delay monitor circuit 14.

The power source voltage supply circuit 13 receives a control signal S14 from the delay monitor circuit 14, adjusts the power source voltage $V_{DD}$ as instructed by the control signal, and supplies to the target circuit 11 and the delay monitor circuit 14.

The delay monitor circuit 14 is a circuit for perceiving critical path delay characteristics of the target circuit 11 and comprises a pulse generation circuit (PLGEN) 141, a delay signal generation circuit (DLGEN) as a delay means, a delay detection circuit (DLDET) 5, a control circuit (CTL) 144, a register (REG) group 145 and a selector 146.

Among the components, the control circuit 144 and the selector 146 compose a switching means.

The pulse generation circuit 141 generates a pulse S141a equal to one cycle of the clock CK and a delay detection pulse S141b based on the clock CK supplied from the clock generation circuit 12, outputs the pulse S141a to the delay signal generation circuit 142, and supplies the delay detection pulse S141b to the delay detection circuit 143.

The delay signal generation circuit 142 has a plurality of delay elements having a delay component to cause signal propagation delay inside the target circuit 11 and supplied with the power source voltage $V_{DD}$ from the power source voltage supply circuit 13.

The delay signal generation circuit 142 switches the configuration of a delay element array based on first configuration information CNFG1 or second configuration information CNFG2 supplied as a signal S146 by being selected by the selector 146 from the two set by a plurality of registers of the register group 145, the pulse S141a by the pulse generation circuit 141 is propagated to the switched delay element array, and a pulse after the propagation is output as a delay signal S142 to the delay detection circuit 143.

Figure 2:
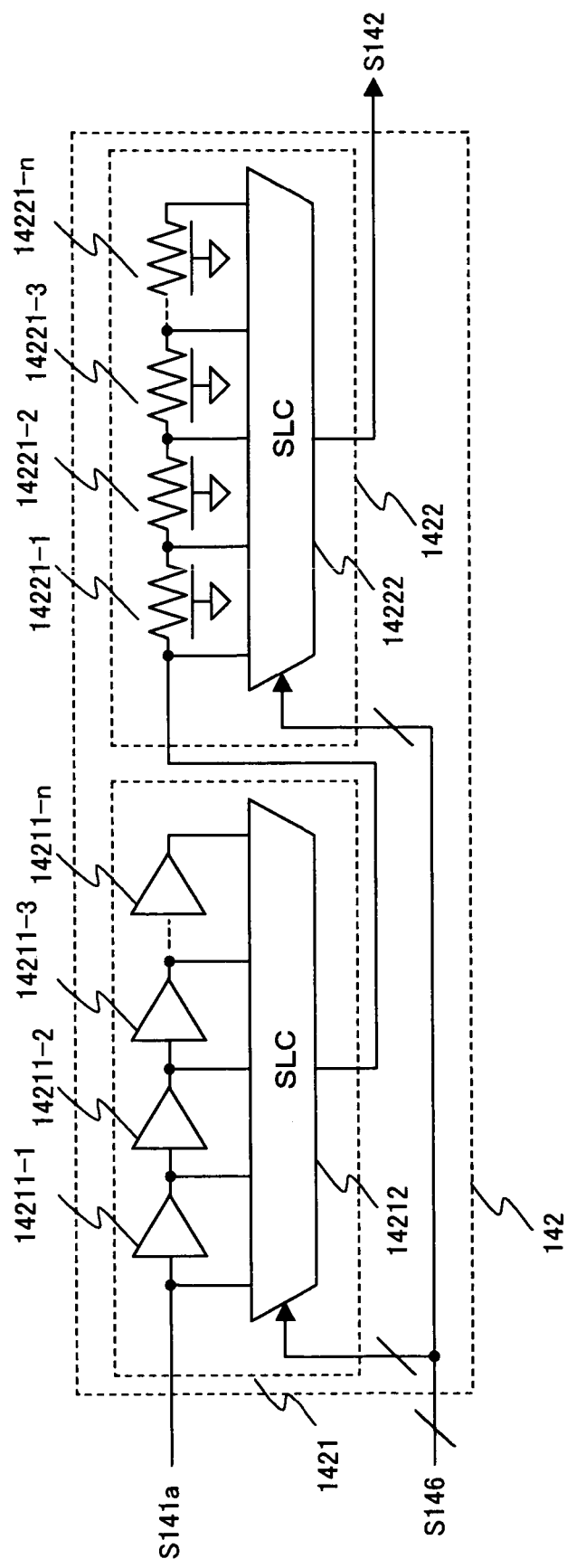
FIG. 2 is a view of an embodiment of a delay signal generation circuit.

FIG. 2 is a circuit diagram of a specific example of the configuration of a delay signal generation circuit according to the present embodiment.

The delay signal generation circuit 142 is configured by serially connecting a gate element array 1421 and a wiring delay array 1422, wherein the configuration can be adjusted (switchable).

The gate element array 1421 has a plurality of gate elements 14211-1, 14211-2, 14211-3 . . . , 14211-n connected in series to an input of the pulse S141, and a selector 14212.

The selector 14212 is connected to output terminals of the respective gates elements 14211-1 to 14211-n, selects any one of outputs of the gate elements 14211-1 to 14211-n or an input pulse S141a based on the signal S146 by the selector 146 and outputs to the wiring delay array in the next stage.

The wiring delay array 1422 has a plurality of wiring (for example RC) delay elements 14221-1, 14221-2, 14221-3, . . . , 14221-n connected in series to an output of the selector 14212 of the gate element array, and a selector 14222.

The selector 14222 is connected to output terminals of the respective wiring delay elements 14221-1 to 14221-n, selects any one of outputs of the wiring delay elements 14221-1 to 14221-n or an output pulse of gate element arrays 1421 of all stages based on the signal S146 by the selector 146, and outputs as a signal S142 to the delay detection circuit 143.

As explained above, in the delay signal generation circuit 142, the number of stages of element arrays can be changed in accordance with the signal S146 indicating configuration information set in the register group 145, and characteristics of the delay signal generation circuit 142 can be adjusted to the same characteristics as those of the critical path of the target circuit 11.

Here, a buffer and wiring were taken as an example of the delay element composing the delay signal generation circuit 142, but it is not limited to this and a delay element to be a cause of signal delay inside an LSI may be added other than that.

The delay detection circuit 143 detects a delay amount of the delay signal S142 including delay generated in the delay signal generation circuit 142 by using the delay detection pulse S141b by the pulse generation circuit 141 and outputs a detection signal S143 to the control circuit 144.

FIG. 3A to FIG. 3E are timing charts for explaining a delay detection operation of the delay detection circuit 143.

FIG. 3A shows a clock CK generated by the clock generation circuit 12, FIG. 3B shows a propagation pulse S141a generated by the pulse generation circuit 141, FIG. 3C and FIG. 3D show a delay signal S142 generated by the delay signal generation circuit 142, and FIG. 3E shows a delay detection pulse S141b generated by the pulse generation circuit 141.

When the delay signal S142 is input before the delay detection pulse S141b as shown in FIG. 3C and FIG. 3E, the delay detection circuit 143 detects as a delay amount a time from rising of the delay detection pulse S142 to rising of the delay detection pulse S141c, and outputs the detection signal S143 to the control circuit 144.

When the delay signal S142 is input after the delay detection pulse S141b as shown in FIG. 3D and FIG. 3E, the delay detection circuit 143 detects as a delay amount a time from rising of the delay detection pulse S141b to rising of the delay signal S142, and outputs the detection signal S143 to the control circuit 144.

The detection signal S143 includes first delay information when a delay element array based on the first configuration information CNFG1 set in a first register REGa of the register group 145 is propagated in the delay signal generation circuit 142, and second delay information when a delay element array based on the second configuration information CNFG2 set in the second register REGb of the register group 145 is propagated in the delay signal generation circuit 142.

Also, the first delay information and the second delay information are alternately supplied in a time sharing way as will be explained later on.

The control circuit 144 generates a control signal S14 based on delay information of the detection signal S143 by the delay detection circuit 143 to control the power source voltage supply circuit 142, so that a delay value of the output signal S142 of the delay signal generation circuit 142 fits in one cycle of the clock CK and a timing of rising of the delay detection pulse S141b matches with a timing of rising of the delay signal S142.

In the present embodiment, the control circuit 144 controls the power source voltage $V_{DD}$, so that a delay value of the delay signal S142 of the delay signal generation circuit 142 fits in one cycle of the clock CK and a timing of rising of the delay detection pulse S141b matches with a timing of rising of the delay signal S142.

Accordingly, as shown in FIG. 3C, when the delay value DLV fits in one cycle of the clock CK and the timing of rising of the delay signal S142 comes earlier than the timing of rising of the delay detection pulse S141b, the control circuit 144 outputs to the power source voltage supply circuit 13 a control signal S14 for instructing to change the power source voltage to be lower than the current voltage value.

On the other hand, as shown in FIG. 3D, when the delay value DLV does not fit in one cycle of the clock CK and the timing of rising of the delay signal S142 comes later than the timing of rising of the delay detection pulse S141b, the control circuit 144 outputs to the power source voltage supply circuit 13 a control signal S14 for instructing to change the power source voltage to be higher than the current voltage value.

The control circuit 144 according to the present embodiment compares the first delay information in the case where a delay element array based on the first configuration information CNFG1 included in the delay detection circuit 143 is propagated to the second delay information in the case where a delay element array based on the second configuration information CNFG2 is propagated, judges the one with the larger delay value DLV as final delay information and outputs to the power source voltage supply circuit 13 a control signal S14 for instructing to change the power source voltage.

Specifically, when delay values of the first and second delay information fit in one cycle of the clock CK as shown in FIG. 3C, the control circuit 144 judge s that a result with the smaller phase difference error as the final delay information and outputs a control signal S14 to the power source voltage supply circuit 13 for instructing to change the power source voltage.

When a delay value of the first delay information fits in one cycle of the clock CK as shown in FIG. 3C and a delay value of the second delay information does not fit in one cycle of the clock CK as shown in FIG. 3D, the control circuit 144 outputs a control signal S14 to the power source voltage circuit 13 for instructing to change the power source voltage to be higher than the current voltage value based on the delay value of the second delay information.

Similarly, when a delay value of the second delay information fits in one cycle of the clock CK as shown in FIG. 3C and a delay value of the first delay information does not fit in one cycle of the clock CK as shown in FIG. 3D, the control circuit 144 outputs a control signal S14 to the power source voltage circuit 13 for instructing to change the power source voltage to be higher than the current voltage value based on the delay value of the first delay information.

When delay values of the first and second delay information do not fit in one cycle of the clock CK as shown in FIG. 3D, the control circuit 144 judges that the one with the larger result of the delay value of the first delay information and the delay value of the second delay information is the final delay information and outputs to the power source voltage supply circuit 13 a control signal S14 for instructing to change the power source to be higher than the current voltage value.

Also, the control circuit 144 outputs to the selector 146 a selection signal S144 for controlling it to select in a time sharing way the first configuration information CNFG1 set in the first register REGa of the register group 145 and the second configuration information CNFG2 set in the second register REGb of the register group 145 and to output to the delay signal generation circuit 142.

The register group 145 has the first register REGa to which the first configuration information CNFG1 of the delay signal generation circuit 142 is set and the second register REGb to which the second configuration information CNFG2 of the delay signal generation circuit 142 is set, and outputs the set first configuration information CNFG1 and the second configuration information CNFG2 to the selector 146.

The selector 146 selects by switching for every predetermined time, that is selects in a time sharing way, the first configuration information CNFG1 set in the first register REGa and the second configuration information CNFG2 set in the second register REGb in response to the instruction by the selection signal S144 of the control circuit 144, and outputs to the delay signal generation circuit 142.

Next, an operation by the above configuration will be explained with reference to FIG. 4 and FIG. 5.

FIG. 4 is a schematic view of switching of critical paths having different delay characteristics. In FIG. 4, an axis of abscissa indicates a power source voltage $V_{DD}$ and an axis of ordinate indicates a delay time TDLY, respectively.

Figure 5:
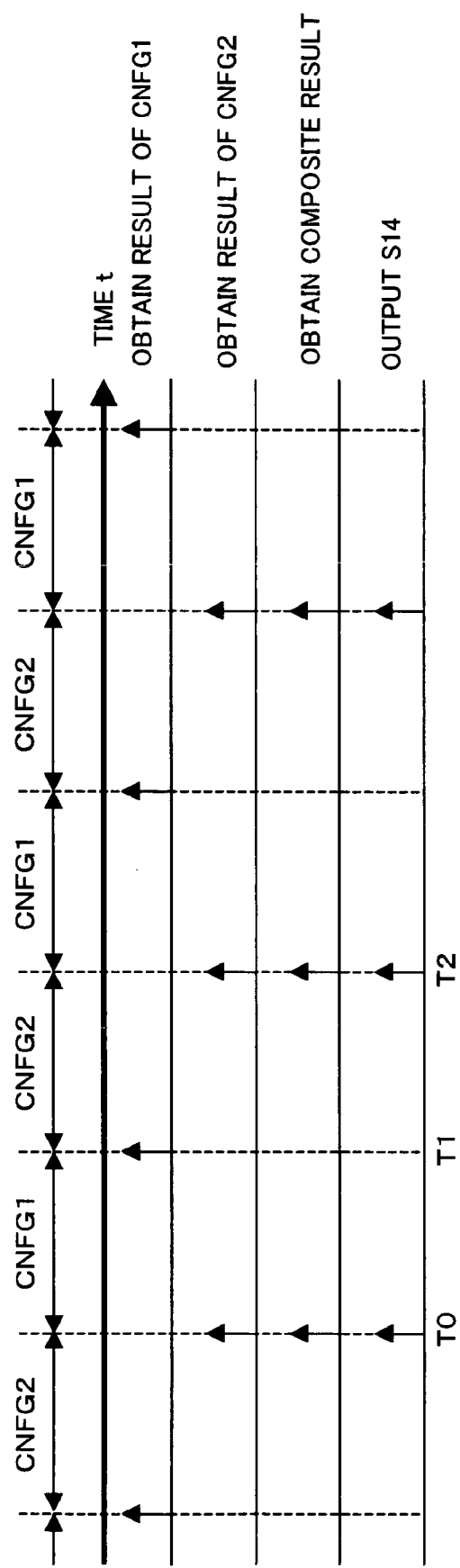
FIG. 5 is a view of a time sharing operation (time sharing for two configuration information) in the first embodiment.

FIG. 5 is a view for explaining a time sharing operation (time sharing for two configuration information) in the first embodiment.

The first configuration information CNFG1 is set in the first register REGa of the register group, the second configuration information CNFG2 is set in the second register REGb, and the two are respectively supplied to the selector 146.

In the selector 146, based on the instruction by the control signal S144 of the control circuit 144, the first configuration information CNFG1 set in the first register REGa of the register group and the second configuration information CNFG2 set in the second register REGb are selected in a time sharing way for every predetermined time, and output to the delay signal generation circuit 142.

In the delay signal generation circuit 142, a power source voltage $V_{DD}$ is supplied from the power source voltage supply circuit 13, the configuration of the delay element array is switched based on a first configuration information CNFG1 or second configuration information CNFG2 selected by the selector 146 and supplied as a signal S146 from the two set in a plurality of registers of the register group 145.

In the delay signal generation circuit 142, the pulse S141a generated by the pulse generation circuit 141 is propagated by a delay element array configured based on the signal S146. A pulse after propagating the delay element array is output as a delay signal S142 to the delay detection circuit 143.

The delay signal generation circuit 142 alternately outputs in a time sharing way a first delay signal S142 including the first delay information of the first delay element array based on the first configuration information CNFG1 and a second delay signal S142 including the second delay information of the second delay element array based on the second configuration information CNFG2.

For example, delay characteristics based on the first configuration information CNFG1 set in the first register REG1 have the characteristics indicated by the sign A in FIG. 4, delay characteristics based on the second configuration information set to the second register REGb have characteristics indicated by the sign B in the figure, and first and second delay information in accordance with the delay characteristics are supplied as delay signals S142 to the delay detection circuit 143 in the time sharing way.

In the delay detection circuit 143, a delay amount of the respective delay signals S142 including the first delay information and the second delay information generated in the delay signal generation circuit 142 is detected by using the delay detection pulse S141b by the pulse generation circuit 141, and the detection result is output as a detection signal S143 to the control circuit 144.

In the control circuit 144, the first delay information in the case of propagating a delay element array based on the first configuration information CNFG1 is compared with the second delay information in the case of propagating a delay element array based on the second configuration information CNFG2 included in the delay detection circuit 143, and one with the larger delay amount DLV is judged to be the final delay information. Then, based on the judgment result, a control signal S14 for instructing to change the power source voltage to be higher or lower than the current voltage value is output to the power source voltage supply circuit 13.

The operation of switching the configuration information of the delay signal generation circuit in a time sharing way as above will be explained further in detail with reference to FIG. 5.

As shown in FIG. 5, at time T0, the control circuit 144 instructs the selector 146 to supply the first configuration information CNFG1 of the first register REGa by the selection signal S144 to the delay signal generation circuit 142.

Then, the first delay information including a delay amount (time) with respect to the delay detection pulse S141b of the delay signal S142 propagated with the first delay element array is supplied as a detection signal S143 to the control circuit 144.

At the time (time T1) when the control circuit 144 obtains the first delay information by the first configuration information CNFG1, the control circuit 144 outputs a selection signal S144 for instructing to switch the configuration information to be sent to the delay generation circuit 142 to the second configuration information CNFG2 of the second register REGb.

The second delay information including the delay amount (time) with respect to the delay detection pulse S141b of the delay signal S142 propagated with the second delay element array is supplied as a detection signal S143 to the control circuit 144.

When the control circuit 144 receives the second delay information by the second configuration information CNFG2 (time T2), respective results of the first configuration information CNFG1 and the second configuration information CNFG2 are compared in the control circuit 144.

As a result of the comparison, the one with the larger delay is judged to be the final delay information and output to the power source voltage supply circuit 13 a control signal S14 for instructing to change the power source voltage.

In parallel with that, the control circuit 144 instructs the selector 146 by the selection signal S144 to supply the first configuration information CNFG1 of the first register REGa again to the delay signal generation circuit 142.

The same processing will be repeated thereafter.

As a result, characteristics with the larger delay in the characteristics A and characteristics B in FIG. 4 are obtained as the final characteristics, so that the characteristics C indicated by the sign C in FIG. 4 can be realized.

As explained above, according to the first embodiment, the delay signal generation circuit 142 for switching the configuration of a delay element array based on the first configuration information CNFG1 or the second configuration information CNFG2 and generating a delay signal S142 by propagating a delay element array wherein a pulse S141 is switched, a register group 145 having a first register REGa to be set the first configuration information CNFG1 of the delay signal generation circuit 142 and a second register REGb to be set the second configuration information CNFG2 of the delay signal generation circuit 142, a selector 146 for selecting and outputting the first configuration information CNFG1 set in the first register REGa and the second configuration information CNFG2 set in the second register REGb to the delay signal generation circuit 142 in a time sharing way, a delay detection circuit 143 for detecting a delay amount of the delay signal S142, and a control circuit 144 for controlling a power source voltage supply circuit 13 by generating a control signal S14, so that a delay amount of the delay signal S142 fits in one cycle of a clock CK and a timing of rising of the delay detection pulse S141b matches a timing of rising of the delay signal S142 based on the delay information by the delay detection circuit 143 and outputting to the selector 146 a selection signal S144 for instructing to select from the first configuration information CNFG1 set in the first register REGa and the second configuration information CNFG2 set in the second register REGb in a time sharing way and output to the delay signal generation circuit 142 are provided, therefore, the effects below can be obtained.

Namely, the present invention is to obtain equivalent characteristics to composite delay characteristics generated by a plurality of delay generation circuits by switching configuration information of a delay generation circuit stored in a register group in a time sharing way, wherein a plurality of delay signal generation circuits are not necessary for combining a plurality of characteristics, so that an increase of the circuit scale can be suppressed.

Note that in the present embodiment, an example of switching two sets of configuration information in a time sharing way was explained, but the present invention can be applied in the same way to the configuration with three sets or more.

Second Embodiment

Figure 6:
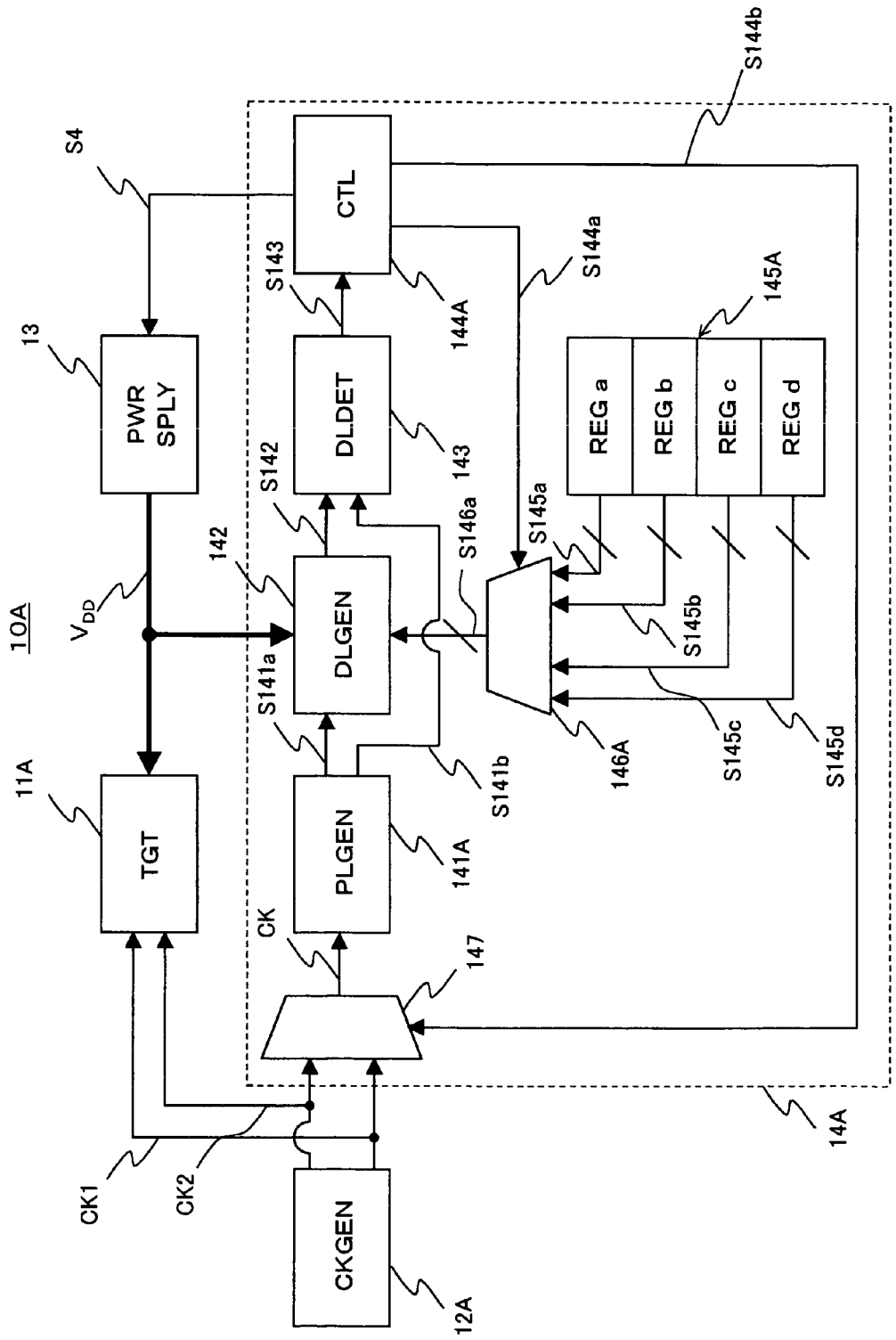
FIG. 6 is a block diagram of a key part of a second embodiment of a semiconductor apparatus according to the present invention.

FIG. 6 is a block diagram of a second embodiment of a semiconductor apparatus according to the present invention.

A different point of the second embodiment from the above first embodiment is that a target circuit 11A comprises a circuit block operating at a plurality of different frequencies.

For example, when a CPU operates at a clock frequency of f1 and a DSP operates at a clock frequency of f2 in an LSI installed with the CPU and the DSP, there is no telling that a circuit of which frequency domain becomes a critical path for the target circuit 11A depending on conditions of an operation voltage and temperature, etc.

Accordingly, it is necessary that the delay monitor circuit 14A monitor delay of the circuits respectively operating at the clock frequency of f1 and clock frequency of f2.

A clock generation circuit 12A according to the present second embodiment generates a clock CK1 of a frequency f1 and a clock CK2 of a frequency f2 and supplies to the target circuit 11A and a monitor circuit 14A.

Also, the monitor circuit 14A further comprises a selector 147, and the selector 147 makes the clock generation circuit 141 to input in accordance with an instruction of a selection signal S144b by the control circuit 144A.

In the second embodiment, a first switching means is composed of a control circuit 144A and a selector 146A, and a second switching means is composed of the control circuit 144A and the selector 147.

A register group 145A comprises first to fourth registers REGa, REGb, REGc and REGd for storing first to fourth configuration information CNFG11 to CNFG14 of the delay signal generation circuit 142 corresponding to two frequency domains of the clocks CK1 and CK2.

Here, the first and second registers REGa and REGb store the first and second configuration information CNFG11 and CNFG12 corresponding to a frequency domain of the clock CK1, and the third and fourth registers REGc and REGd store the third and fourth configuration information CNFG13 and CNFG14 corresponding to a frequency domain of the clock CK2, Below, a time sharing operation in the case of provided with a plurality of clock frequency domains will be explained by focusing on functions of the control circuit 144A according to the present second embodiment with reference to FIG. 7 and FIG. 8.

First, an explanation will be made based on FIG. 7.

Figure 7:
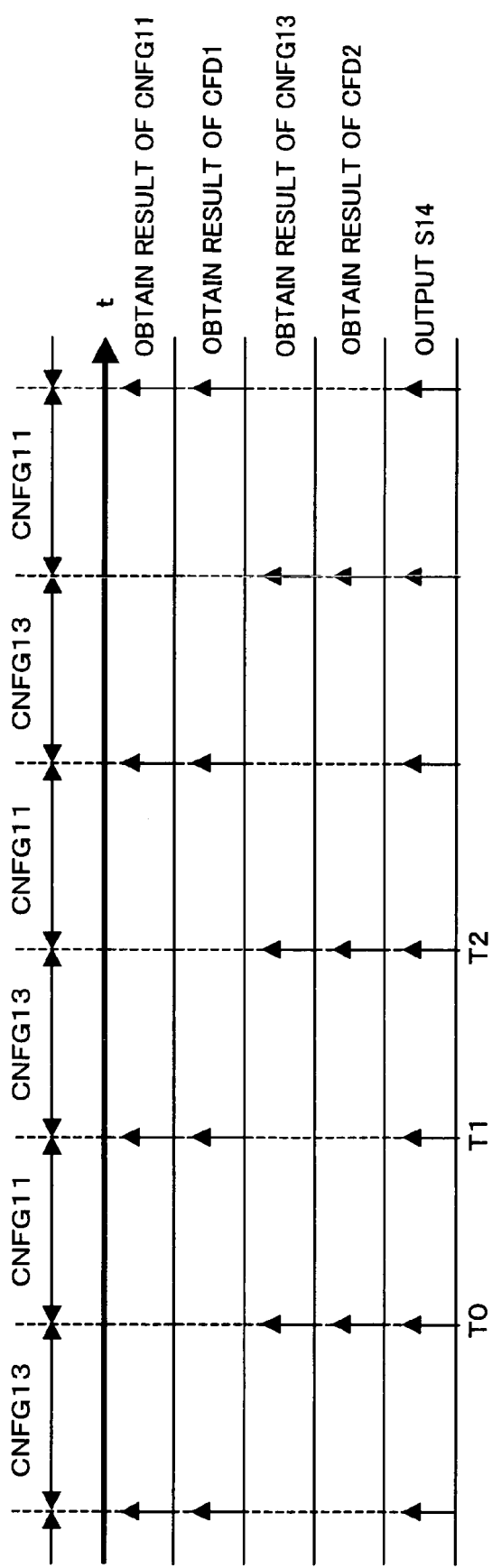
FIG. 7 is a view of a time sharing operation (time sharing for two clock frequency domains) in the second embodiment.

FIG. 7 is an example of operating with one configuration information for one frequency domain.

In this case, the control circuit 144A compares first delay information in the case of propagating a delay element array based on the first configuration information CNFG11 with third delay information in the case of propagating a delay element array based on the third configuration information CNFG13, and outputs to the power source voltage supply circuit 13 a control signal S14 for instructing to change a power source voltage based on delay information with the larger delay ratio with respect to the clock cycle.

Below, further detailed explanation will be given.

At time T0, the control circuit 144A outputs a selection signal S146a for instructing to select the first configuration information CNFG11 of the first register REGa and to send to the delay signal generation circuit 142.

In parallel with that, the control circuit 144A outputs to the selector 147 a selection signal S144b for instructing to select the clock CK1 and to input to the pulse generation circuit 141.

As a result, in the pulse generation circuit 141, a pulse S141a based on the clock CK1 and a delay detection pulse S141b are generated and output to the delay signal generation circuit 142 and the delay detection circuit 143.

In the delay signal generation circuit 142, a delay element array based on the first configuration information CNFG11 is formed, the delay element array is propagated to the pulse S141a, and the delay signal S142 is input to the delay detection circuit 143. Then, the first delay information in the case where a delay element array based on the first configuration information CNFG11 is supplied from the delay detection circuit 143 to the control circuit 144A.

At a point (time T1) that the control circuit 144A obtains the first delay information by the first configuration information CNFG11, delay information of a clock frequency domain CFD1 is fixed.

In the control circuit 144A, the third delay information of the clock frequency domain CFD2 already obtained at the time T0 is compared with the first delay information of the clock frequency domain CFD1 obtained at the time T1, and a control signal S14 for instructing power source change based on delay information with the larger delay ratio with respect to the clock cycle is output to the power source voltage supply circuit 13.

Also, at the time T1, the control circuit 144A outputs a selection signal S146a for instructing to select the third configuration information CNFG13 of the third register REGc and to send to the delay signal generation circuit 142.

In parallel with that, the control circuit 144A outputs to the selector 147 a selection signal S144b for instructing to select the clock CK2 and to input to the pulse generation circuit 141.

As a result, in the pulse generation circuit 141, a pulse S141a based on the clock CK2 and a delay detection pulse S141b are generated and output to the delay signal generation circuit 142 and the delay detection circuit 143.

In the delay signal generation circuit 142, a delay element array based on the third configuration information CNFG13 is formed, the delay element array is propagated to the pulse S141a, and the delay signal S142 is input to the delay detection circuit 143. Then, the third delay information in the case where a delay element array based on the third configuration information CNFG13 is supplied from the delay detection circuit 143 to the control circuit 144A.

At a point (time T2) that the control circuit 144A obtains the third delay information by the third configuration information CNFG13, delay information of a clock frequency domain CFD2 is fixed.

In the control circuit 144A, the delay information of the clock frequency domain CFD1 already obtained at the time T1 is compared with the delay information of the clock frequency domain CFD2 obtained at the time T2, and a control signal S14 for instructing to change the power source based on delay information with the larger delay ratio with respect to the clock cycle is output to the power source voltage supply circuit 13.

Also, at the time T2, the control circuit 144A outputs a selection signal S146a to select the first configuration information CNFG11 in the first register REGa and to send to the delay signal generation circuit 142.

In parallel with that, the control circuit 144A outputs to the selector 147 a selection signal S144b for instructing to select the clock CK1 and to input to the pulse generation circuit 141.

The same processing is repeated thereafter.

From the above processing, it becomes possible to control the power source voltage based on the delay information with the largest delay ratio with respect to the clock cycle among the plurality of clock frequency domains.

Note that in an example in FIG. 7, an example of switching configuration information of two kinds of clock frequency domains in a time sharing way was described, but the present invention can be applied in the same way to the case of being provided with three or more kinds of clock frequency domains.

Next, an example of operating with a plurality of configuration information for respective frequency domains will be explained with reference to FIG. 8.

At the time T0, the control circuit 144A outputs a selection signal S146a for instructing to select the first configuration information CNFG11 of the first register REGa and to send to the delay signal generation circuit 142.

In parallel with that, the control circuit 144A outputs to the selector 147 a selection signal S144b for instructing to select the clock CK1 and to input to the pulse generation circuit 141.

As a result, in the pulse generation circuit 141, a pulse S141a based on the clock CK1 and a delay detection pulse S141*b* are generated and output to the delay signal generation circuit 142 and the delay detection circuit 143.

In the delay signal generation circuit 142, a delay element array based on the first configuration information CNFG11 is formed, the delay element array is propagated to the pulse S141*a*, and the delay signal S142 is input to the delay detection circuit 143. Then, the first delay information in the case where a delay element array based on the first configuration information CNFG11 is supplied from the delay detection circuit 143 to the control circuit 144A.

At the point (time T1) that the control circuit 144A obtains the first delay information by the first configuration information CNFG11, the control circuit 144A outputs a selection signal S146*a* for instructing to select the second configuration information CNFG12 of the second register REGb and to send to the delay signal generation circuit 142.

In the delay signal generation circuit 142, a delay element array based on the second configuration information CNFG12 is formed, the delay element array is propagated to the pulse S141*a*, and the delay signal S142 is input to the delay detection circuit 143. Then the second delay information in the case of propagating the delay element array based on the second configuration information CNFG12 is supplied from the delay detection circuit 143 to the control circuit 144A.

When the control circuit 144A obtains the second delay information by the second configuration information CNFG12 (time T2), respective results of the first configuration information CNFG11 and the second configuration information CNFG12 are compared in the control circuit 144A and a result with the larger delay is selected as delay information of the clock frequency domain CFD1.

In the control circuit 144A, the delay information of the clock frequency domain CFD2 already obtained at time T0 is compared with the delay information of the clock frequency domain CDF1 obtained at the time T2, and a control signal S14 for instructing to change the power source based on the delay information with the larger delay ratio with respect to the clock cycle is output to the power source voltage supply circuit 13.

Also, at the time T2, the control circuit 144A outputs a selection signal S146*a* for instructing to select the third configuration information CNFG13 in the third register REGc and to send to the delay signal generation circuit 142.

In parallel with that, the control circuit 144A outputs to the selector 147 a selection signal S144*b* for instructing to select the clock CK2 and to input to the pulse generation circuit 141.

As a result, in the pulse generation circuit 141, a pulse S141*a* based on the clock CK2 and a delay detection pulse S141*b* are generated and output to the delay signal generation circuit 142 and the delay detection circuit 143.

In the delay signal generation circuit 142, a delay element array based on the third configuration information CNFG13 is formed, the delay element array is propagated to the pulse S141*a*, and the delay signal S142 is input to the delay detection circuit 143. Then, the third delay information in the case where a delay element array based on the third configuration information CNFG13 is supplied from the delay detection circuit 143 to the control circuit 144A.

At the point (time T3) that the control circuit 144A obtains the third delay information by the third configuration information CNFG13, the control circuit 144A outputs a selection signal S146*a* for instructing to select the fourth configuration information CNFG14 in the fourth register REGd and to send to the delay signal generation circuit 142.

In the delay signal generation circuit 142, a delay element array based on the fourth configuration information CNFG14 is formed, the delay element array is propagated to the pulse S141*a*, and the delay signal S142 is input to the delay detection circuit 143. Then the fourth delay information in the case of propagating the delay element array based on the fourth configuration information CNFG14 is supplied from the delay detection circuit 143 to the control circuit 144A.

When the control circuit 144A obtains the fourth delay information by the fourth configuration information CNFG14 (time T4), respective results of the third configuration information CNFG13 and the fourth configuration information CNFG14 are compared in the control circuit 144A and a result with the larger delay is selected as delay information of the clock frequency domain CFD2.

In the control circuit 144A, the delay information of the clock frequency domain CFD1 already obtained at time T2 is compared with the delay information of the clock frequency domain CDF2 obtained at the time T4, and a control signal S14 for instructing to change the power source based on the delay information with the larger delay ratio with respect to the clock cycle is output to the power source voltage supply circuit 13.

Also, at the time T4, the control circuit 144A outputs a selection signal S146*a* for instructing to select the first configuration information CNFG11 in the first register REGa and to send to the delay signal generation circuit 142.

In parallel with that, the control circuit 144A outputs to the selector 147 a selection signal S144*b* for instructing to select the clock CK1 and to input to the pulse generation circuit 141.

The same processing is repeated thereafter.

From the above processing, even in the case where a plurality of clock frequency domains are provided and there are a plurality of configuration information of a delay generation circuit corresponding to the respective frequency domains, it is possible to control the power source voltage based on delay information with the larger delay ratio with respect to the clock cycle.

Figure 8:
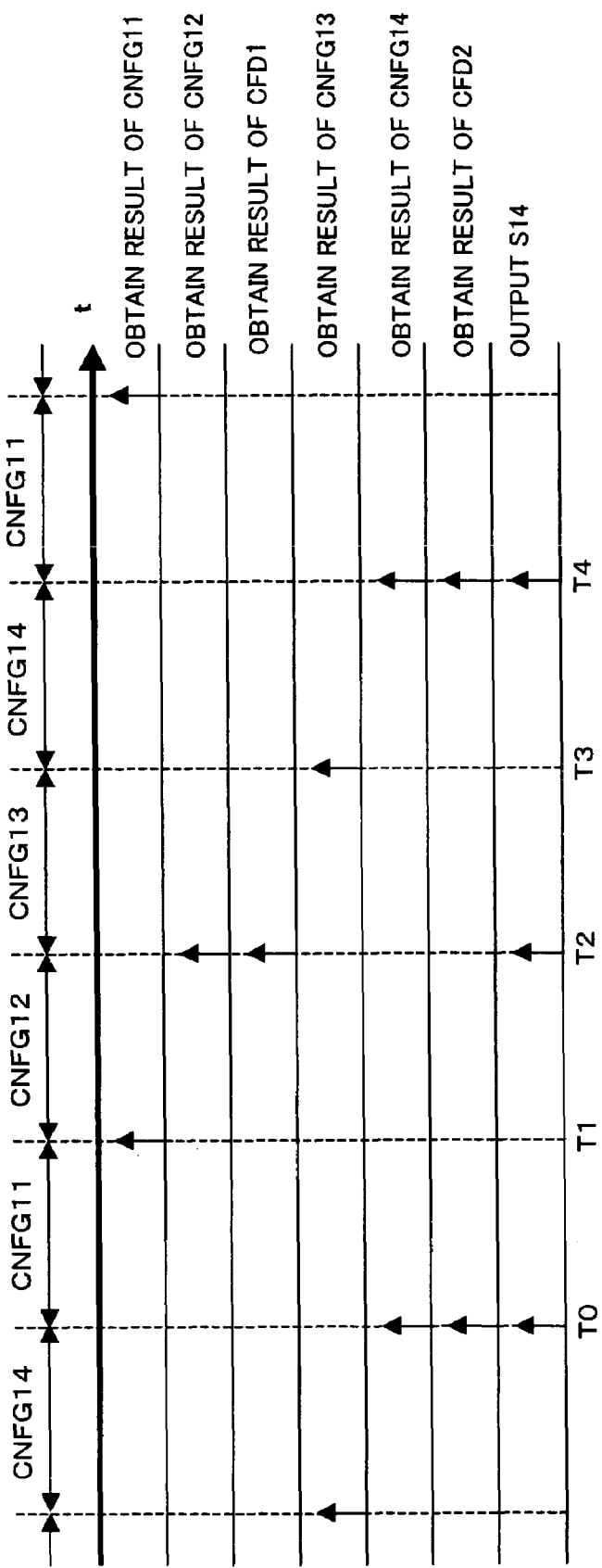
FIG. 8 is a view of a time sharing operation (time sharing for two clock frequency domains and two configuration information) in the second embodiment.

Note that in the example in FIG. 8, an example of switching two sets of configuration information for two kinds of clock frequency domains and one clock frequency domain in a time sharing way was explained, but the present invention can be applied to the case with three or more sets of configuration information for three or more kinds of clock frequency domains and one clock frequency domain.

As explained above, according to the present invention, it becomes unnecessary to provide a plurality of delay signal generation circuits for combining a plurality of delay characteristics, so that an increase of the circuit scale can be suppressed.

Furthermore, the circuit scale necessary for monitoring delay can be reduced and a reduction of a power consumption can be attained.

The embodiments explained above are for easier understanding of the present invention and not to limit the present invention. Accordingly, respective elements disclosed in the above embodiments includes all modifications in designs and equivalents belonging to the technical field of the present invention.

What is claimed is:

1. A semiconductor apparatus having a delay monitor circuit for monitoring critical path delay characteristics of a target circuit, wherein said delay monitor circuit comprises:
    delay means having a plurality of delay elements for forming delay element arrays in accordance with supplied configuration information, wherein said delay means includes a delay component to cause a signal propagation delay in said target circuit;
    a plurality of registers for setting therein a plurality of configuration information for forming said delay element arrays; and
    switching means for selectively switching the configuration information of said plurality of registers and supplying the configuration information to said delay means;
    wherein said configuration information indicates number of stages of element arrays to fabricate delay characteristics of a critical path of said target circuit.

2. The semiconductor apparatus as set forth in claim 1, wherein said switching means switches the configuration information of the delay element arrays set in the plurality of registers in a time sharing manner and supplies the configuration information to said delay means.

3. The semiconductor apparatus as set forth in claim 2, wherein said delay monitor circuit comprises a control means for controlling a power source voltage supplied to said target circuit based on delay information generated by a delay element array formed in a time sharing manner.

4. The semiconductor apparatus as set forth in claim 3, wherein said control means compares a plurality of delay information generated by a plurality of delay element arrays formed in the delay means, judges a delay information with a largest delay value as a final delay information and controls said power source voltage based on the final delay information.

5. A semiconductor apparatus having a delay monitor circuit for monitoring critical path delay characteristics of a target circuit including a plurality of circuits operating at a plurality of different clock frequencies, wherein said delay monitor circuit comprises:
    delay means having a plurality of delay elements for forming delay element arrays in accordance with supplied configuration information, wherein said delay means includes a delay component to cause a signal propagation delay in said target circuit;
    a plurality of registers for setting therein a plurality of configuration information for forming said delay element arrays in accordance with said plurality of different clock frequencies;
    first switching means for selectively switching the configuration information of said plurality of registers and supplying the configuration information to said delay means; and
    second switching means for selectively switching said plurality of different clock frequencies for supply to said delay means;
    wherein said configuration information indicates number of stages of element arrays to fabricate delay characteristics of a critical path of said target circuit.

6. The semiconductor apparatus as set forth in claim 5, wherein:
    said first switching means switches the configuration information of delay element arrays set to a plurality of registers in a time sharing manner and supplies the configuration information to said delay means; and
    said second switching means switches said plurality of different clock frequencies in a time sharing manner for supply to said delay means.

7. The semiconductor apparatus as set forth in claim 6, wherein said delay monitor circuit comprises a control means for controlling a power source voltage for supplying to said target circuit based on delay information generated by a delay element array formed in a time sharing manner.

8. The semiconductor apparatus as set forth in claim 7, wherein said control means compares a plurality of delay information generated by a plurality of delay element arrays formed in said delay means, and controls said power source voltage based on a delay information with a largest delay ratio with respect to a clock cycle in a plurality of clock frequency domains.

9. The semiconductor apparatus as set forth in claim 8, wherein said plurality of registers have set therein a plurality of configuration information corresponding to the respective clock frequency domains.

10. The semiconductor apparatus as set forth in claim 1, wherein said delay means has a plurality of delay elements having at least two delay components to cause signal propagation delay inside the target circuit.

11. The semiconductor apparatus as set forth in claim 5, wherein said delay means has a plurality of delay elements having at least two delay components to cause signal propagation delay inside the target circuit.

* * * * *